US009233845B2

(12) United States Patent
Gerasimos et al.

(10) Patent No.: US 9,233,845 B2
(45) Date of Patent: Jan. 12, 2016

(54) OPTOELECTRONIC PLATFORM WITH CARBON BASED CONDUCTOR AND QUANTUM DOTS AND TRANSISTOR COMPRISING SUCH A PLATFORM

(75) Inventors: Konstantatos Gerasimos, Barcelona (ES); Koppens Frank, Barcelona (ES)

(73) Assignee: Fundacio Institut De Ciencies Fotoniques, Barcelona (ES)

( * ) Notice: Subject to any disclaimer, the term of this patent is extended or adjusted under 35 U.S.C. 154(b) by 396 days.

(21) Appl. No.: 13/563,820

(22) Filed: Aug. 1, 2012

(65) Prior Publication Data

US 2013/0032782 A1    Feb. 7, 2013

(30) Foreign Application Priority Data

Aug. 2, 2011    (ES) .................... 201131345

(51) Int. Cl.
| | |
|---|---|
| *H01L 31/0352* | (2006.01) |
| *B82Y 10/00* | (2011.01) |
| *B82Y 20/00* | (2011.01) |
| *H01L 29/06* | (2006.01) |
| *H01L 29/16* | (2006.01) |
| *H01L 29/423* | (2006.01) |
| *H01L 51/42* | (2006.01) |
| *H01L 51/00* | (2006.01) |

(52) U.S. Cl.
CPC ............ *B82Y 10/00* (2013.01); *B82Y 20/00* (2013.01); *H01L 29/0665* (2013.01); *H01L 29/0673* (2013.01); *H01L 29/1606* (2013.01); *H01L 29/42364* (2013.01); *H01L 51/428* (2013.01); *H01L 51/0048* (2013.01); *H01L 51/4213* (2013.01); *Y02E 10/549* (2013.01)

(58) Field of Classification Search
CPC ............ H01L 51/42; H01L 51/0036; H01L 31/022466; H01L 51/0047; H01L 51/424; H01L 2251/308; H01L 51/0002; H01L 51/0006; H01L 51/0034; H01L 51/0039; H01L 51/0046; H01L 51/0078; H01L 51/4246; H01L 51/5012
USPC ............ 257/40, E21.499, E31.011, E31.039, 257/E31.11, 12, 453, 77, 85, 94
See application file for complete search history.

(56) References Cited

U.S. PATENT DOCUMENTS

| 8,476,727 B2 * | 7/2013 | Tian et al. .................... 257/444 |
| 2005/0045867 A1 | 3/2005 | Ozkan et al. |
| 2007/0151601 A1 * | 7/2007 | Jung et al. .................... 136/263 |

(Continued)

FOREIGN PATENT DOCUMENTS

JP    2006-332540    12/2006

OTHER PUBLICATIONS

Emin, S. et al.: "Colloidal quantum dot solar cells". Solar Energy, Mar. 12, 2011, vol. 85, Elsevier Ltd., pp. 1264-1282, ISSN 0038092X.*

(Continued)

*Primary Examiner* — Stephen W Smoot
*Assistant Examiner* — Edward Chin
(74) *Attorney, Agent, or Firm* — Gary J. Gershik; Cooper & Dunham LLP

(57) ABSTRACT

The invention comprises an optoelectronic platform with a carbon-based conduction layer and a layer of colloidal quantum dots on top as light absorbing material. Photoconductive gain on the order of $10^6$ is possible, while maintaining de operating voltage low. The platform can be used as a transistor.

8 Claims, 5 Drawing Sheets

(56) References Cited

U.S. PATENT DOCUMENTS

| | | | |
|---|---|---|---|
| 2009/0266418 A1* | 10/2009 | Hu et al. | 136/260 |
| 2009/0301565 A1* | 12/2009 | Curran et al. | 136/263 |
| 2010/0019334 A1* | 1/2010 | Ivanov et al. | 257/432 |
| 2010/0044676 A1* | 2/2010 | Sargent et al. | 257/21 |
| 2012/0228157 A1* | 9/2012 | Li et al. | 205/780 |
| 2013/0240348 A1* | 9/2013 | Mi et al. | 204/157.5 |
| 2014/0042390 A1* | 2/2014 | Gruner et al. | 257/14 |

OTHER PUBLICATIONS

Emin, S. et al., "Colloidal quantum dot solar cells", Solar Energy, 2011, vol. 85, pp. 1264-1282.

Konstantatos, G. et al., "Ultrasensitive solution-cast quantum dot photodetectors", Nature, 2006, vol. 442, No. 13, pp. 180-183.

Spanish Report on the State of the Art issued by the International Searching Authority (ISA/O.E.P.M.) on Nov. 15, 2011 in connection with Spanish Application No. ES 201131345.

Jeong, S.Y. et al., "Photocurrent of CdSe nanocrystals on single-walled carbon nanotube-field effect transistor", Applied Physics Letters, AIP, American Institute of Physics, Melville, NY, US, vol. 92, No. 24, 2008, pp. 243103-234103.

Kang, Y. and Kim, D., "Enhanced optical sensing by carbon nanotube functionalized with CdS particles", Sensors And Acuators A, vol. 125, No. 2, 2006, pp. 114-117.

Konstantatos, G., and Sargent, E., "Nanostructured materials for photon detection", Nature Nanotechnology, vol. 5, No. 6, 2010, pp. 391-400.

Singh, V., et al., "Graphene based materials: Past, present and future", Progress In Materials Scinece, vol. 56, No. 8, 2011, pp. 1178-1271.

Yang, H.Y. et al., "Enhancement of the photocurrent in ultraviolet photodetecters fabricated utilizing hybrid polymer-ZnO quantum dot nanocomprosites due to an embedded graphene layer", Organic Electronic, vol. 11, No. 7, 2010, pp. 1313-1317.

PCT International Preliminary Report on Patentability issued Nov. 6, 2013 in connection with International Application No. PCT/EP2012/064979

* cited by examiner

OPTOELECTRONIC PLATFORM WITH CARBON BASED CONDUCTOR AND QUANTUM DOTS AND TRANSISTOR COMPRISING SUCH A PLATFORM

This application claims priority of Spanish Patent Application No. P 201131345, filed Aug. 2, 2011, the entire contents of which are hereby incorporated by reference into this application.

FIELD OF THE INVENTION

The present invention relates to optoelectronic platforms. In particular, to a platform where photoconductive gain is improved.

BACKGROUND OF INVENTION

Photodiodes (InGaAs for short-wavelength infrared and Si for visible and near infra-red applications) demonstrate high sensitivity. However they are limited by read-out noise and their quantum efficiency is limited to unity (i.e. 1 carrier per absorbed photon). In view of the absence of photoconductive gain in photodiodes, APDs (avalanche photodiodes) have been developed to provide gain via carrier multiplication effects. The gain in these devices is on the order of 100 to 1000 carriers per absorbed photon. The technological challenges in integrating these structures to common image sensors and low-cost detectors is the high operating bias required (on the order of 100's of V) and additional layers required to suppress leakage currents and prolong the device lifetime from degradation due to the high applied bias. Moreover, these devices are not monolithically integrable to CMOS electronics due to the different growth process required for APDs.

SUMMARY OF THE INVENTION

The present invention overcomes the problems of the prior art by providing an optoelectronic platform comprising a carbon-based conduction layer and a layer of colloidal quantum dots for absorbing light on top of it. The platform has advantageously a substrate and an oxide interlayer between the substrate and the carbon-based layer. The carbon-based layer is preferably made of graphene, reduced graphene oxide or carbon nanotubes. The substrate can be one of Boron Nitride or GaAs and the oxide interlayer one or a mixture of $SiO_2$ LiF, Alumina and Hafnium oxide. The quantum dots can be one or more of the following materials: CdSe, CdS, PbSe, ZnO, ZnS, CZTS, $Cu_2S$, $Bi_2S_3$, $Ag_2S$, HgTe, CdHgTe, InAs, InSb. The carbon-based layer can be shaped in the form of either a rectangle, nanoconstriction, hall-bar or ribbon. The invention comprises also a transistor with source and drain electrodes and such a platform, and comprises optionally a top electrode in contact with the quantum dots layer.

BRIEF DESCRIPTION OF THE DRAWINGS

To complete the description and in order to provide for a better understanding of the invention, a set of drawings is provided. Said drawings illustrate a preferred embodiment of the invention, which should not be interpreted as restricting the scope of the invention, but just as an example of how the invention can be embodied. The drawings comprise the following figures.

DESCRIPTION OF THE INVENTION

Figure 1:
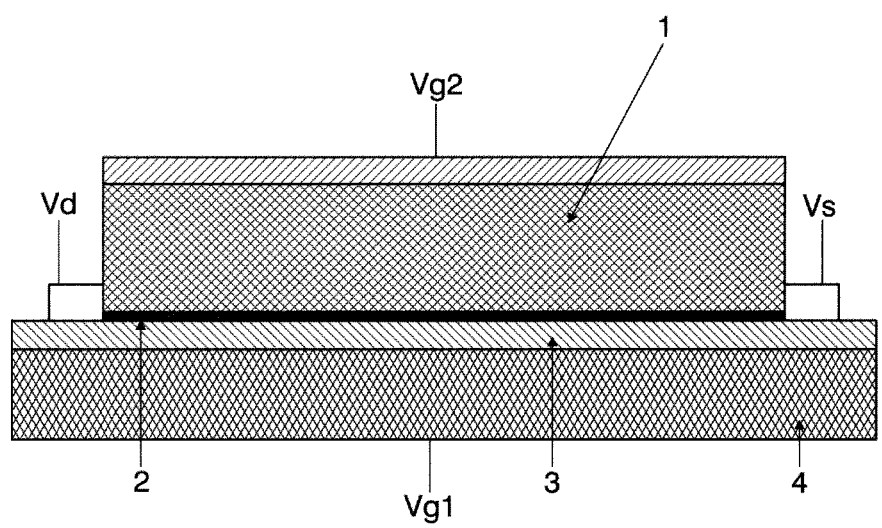
FIG. 1: shows a first embodiment of the invention.

The invention is an hybrid optoelectronic platform compatible with CMOS integration, which consists of a carbon based layer (for example graphene) sensitized with colloidal quantum dots (CQDs). The carbon based layer is used as the carrier transport channel, and CQDs are employed as the absorbing material. As shown in FIG. 1, when applied to a phototransistor, a graphene layer (2) is deposited on a silicon substrate (4) with a $SiO_2$ interlayer (3) to form the gate of the phototransistor, and two electrodes are connected to the graphene in the lateral dimension (Vs, Vd) to form the metal contacts of the device analogously to a source and drain electrodes in a FET transistor. Graphene is then overcoated with a layer of CQDs (1) whose bandgap can be tuned according to the size and material of the QDs (CdSe: 400-650 nm, PbS: 650-2000 nm, HgTe: 1500 nm-4000 nm).

Figure 2:
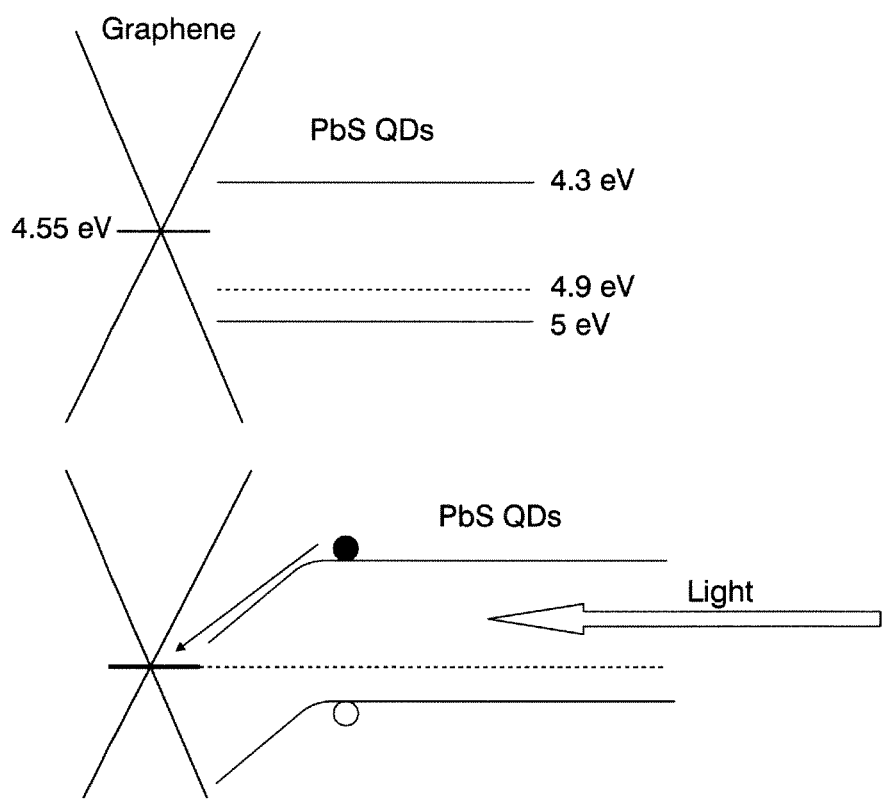
FIG. 2: shows how holes from the quantum dot layer are transferred to the carbon-based layer and thus form a depletion layer.
Figure 3:
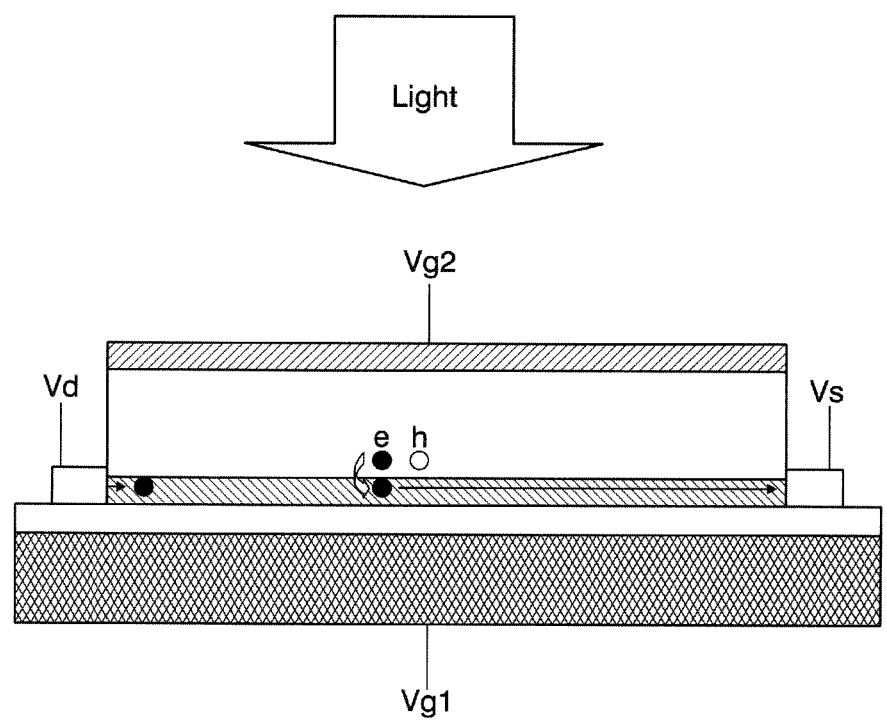
FIG. 3: is a scheme of the working principle of the invention.
Figure 4:
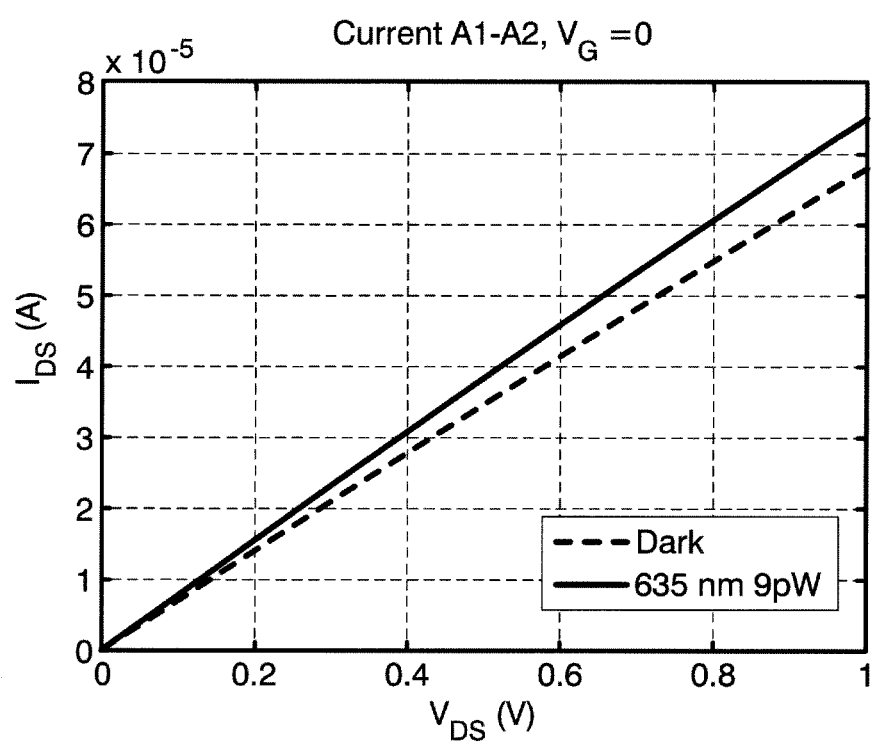
FIG. 4: is a graph of the photoconductive gain at the grapheme channel.

For the description of the underlying mechanism we focus in the case of PbS QDs, but this can be generally applied to other QD materials. At the interface of the QD layer with the graphene there is a built-in field formed due to the doping of the PbS QDs. Holes from the PbS QDs are transferred to the graphene and form a depletion layer in the PbS film and a built-in film as shown in FIG. 2. Incident photons create electron hole pairs in the quantum dots. Due to the band alignment of the QDs to the graphene layer, a single type of carrier (electrons) is then transferred to the graphene layer and transported through graphene to the metal contacts assisted by an applied electric field from the source to the drain. The holes remain trapped in the PbS layer prolonging their carrier lifetime. When the photegenerated electrons in the graphene layer reach the drain contact, another electron is reinjected by the source to provide for charge preservation (FIG. 3). Therefore, for a single absorbed photon an electric carrier is recirculated in the device before it recombines. The heterojunction formed at the graphene-QD layer inhibits recombination and therefore the number of carriers is given by the ratio of the carrier lifetime over the transit time of electrons in the graphene channel. Due to the extremely high carrier mobility offered by the graphene channel a photoconductive gain on the order of $10^6$ has been observed in the invention (FIG. 4). In view of graphene's high mobility, the device requires very low applied electric fields in the source-drain from some µV to a few volts, and the gain can be adjusted linearly with applied voltage. This phenomenon (also called "photogating effect") is equivalent to having a top gate on the graphene layer where the incident light is used to generate carriers in the QD layer which functions as an optically controlled gate.

The proposed device can be operated as a 2-terminal device, with the gate open, or as a phototransistor by controlling the potential of the gate and therefore the conductivity of the graphene channel. The dark current therefrom can be minimized by applying a potential to the gate to switch-off the dark conductivity of the graphene layer (in the case where the graphene has bandgap). An additional gate can be placed on top of the CQD layer to control the electric field in the CQD layer. This gate can be employed to fully deplete a thick layer of QCD film that is employed to fully absorb the incident light. The use of the additional gate can be extended to reset the device and control the temporal response: A high reverse bias signal pulse of the gate Vg2 can switch the direction of the electric field and drive the photogenerated holes trapped in the QD layer into graphene or the photogenerated electrons from the graphene into the QD layer to induce recombination.

Figure 5:
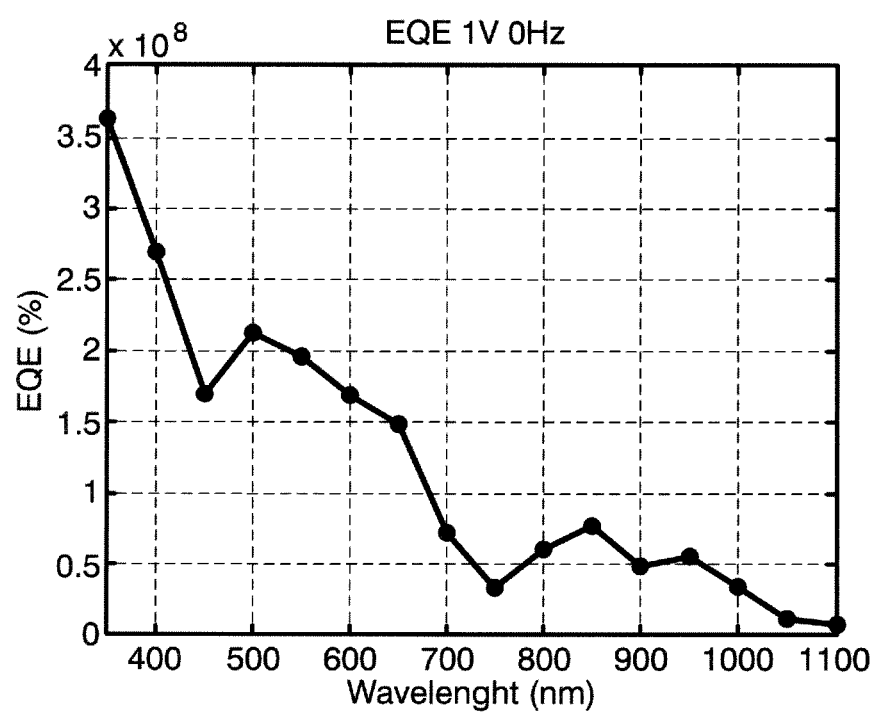
FIG. 5: shows the spectral response of the device of the invention.

The spectral response of the device is shown in FIG. 5. The spectral sensitivity of the graphene is determined by the photon absorption in QD overlayer and can be tuned by appropriate selection of the sensitizing material.

The device can be fabricated by spincasting or spraycasting a layer of QDs from solution. The quantum dots undergo a ligand exchange process to remove the oleic acid from the surface and replace with a bidentate ligand that crosslinks the quantum dots and renders them a conductive solid. Such ligands can be: ethanedithiol, ethylenediamine, hydrazine, ethanethiol, propanethiol, formic acid, oxalic acid, acetic acid, or inorganic moities such as $SnS_4$, $PbBr_2$, $PbI_2$, $PbCl_2$. A bidentate ligand molecule is also employed to electronically couple the QDs to the graphene layer. Such bidentate ligands include: ethanedithiol, ethylene diamine, benzenedithiol, hydrazine. The total thickness of the QD layer can be tuned from a few nm to several hundreds of nm in order to fully absorb the incident light.

The carbon-based layer can be a layer of carbon nanotubes (CNT) or patterned graphene or reduced graphene oxide. CNTs can be grown by cvd and transferred to the substrate. Single or multi-layer graphene is grown by cvd, solution-processing and then transferred to the substrate, or graphene is exfoliated and then transferred to the substrate. Patterning of the carbon-based conductor can be done a wide variety of techniques, such as chemical or plasma-etching, or by thermally activated nanoparticles, ion-beam, scanning-probe lithography or layer-by-layer removal. An alternative method to make graphene nano-ribbons is to zip open nanotubes.

The QDs can be (and not limited to): CdSe, CdS, PbSe, ZnO, ZnS, CZTS, $Cu_2S$, $Bi_2S_3$, $Ag_2S$, HgTe, CdHgTe, InAs, InSb, etc.

The QD semiconductor material can be of p-type, n-type or intrinsic. The photosensitive semiconductor material can be a conjugated polymer or a dye, deposited by spincoating, spraycasting, dropcasting or evaporated onto grapheme.

The carbon-based conductor is patterned in any specific geometry such as rectangle, nanoconstriction, hall-bar or ribbon (a strip only a few nm wide). When the carbon-based layer consists of graphene then it can be made of a single layer or multiple layers of graphene. The graphene layer(s) can be modified so as to open a bandgap in the carbon-based layer. This allows to reduce the dark current of the device and electrically switch off the transistor channel. Further modifications to reduce the dark current of the device and allow for single photon detection include the formation of nanoconstrictions of the carbon-based channel that can provide for coulomb blockade phenomena that can reduce the dark current and enable for single photon detection.

The substrate layer can be of Si, Boron Nitride, GaAs etc. and the dielectric interlayer can be any oxide, like $SiO_2$, LiF, Alumina, Hafnium oxide etc.

The invention can find applications in imaging sensors for digital cameras, remote sensing, night vision and single photon detection etc, in optical communications for low power level transmission and detection and in optical instrumentation for ultra low power detection, among others.

In this text, the term "comprises" and its derivations (such as "comprising", etc.) should not be understood in an excluding sense, that is, these terms should not be interpreted as excluding the possibility that what is described and defined may include further elements.

On the other hand, the invention is obviously not limited to the specific embodiment(s) described herein, but also encompasses any variations that may be considered by any person skilled in the art (for example, as regards the choice of materials, dimensions, components, configuration, etc.), within the general scope of the invention as defined in the claims.

The invention claimed is:

1. An optoelectronic platform comprising a carbon-based conduction layer (2) on top of a substrate and a layer of colloidal quantum dots for absorbing light (1) on top of the carbon-based conduction layer (2), wherein the carbon-based conduction layer is a distinct layer which comprises graphene, reduced graphene oxide or carbon nanotubes.

2. The optoelectronic platform according to claim 1 further comprising a substrate (4) and a dielectric interlayer (3) between the substrate and the carbon-based layer.

3. The optoelectronic platform according to claim 2 wherein the substrate comprises Si, Boron Nitride or GaAs and the dielectric interlayer comprises $SiO_2$ LiF, Alumina on or Hafnium oxide.

4. The optoelectronic platform according to claim 1 wherein the quantum dots comprise of one or more of the following materials: CdSe, CdS, PbSe, ZnO, ZnS, CZTS, $Cu_2S$, $Bi_2S_3$, $Ag_2S$, HgTe, CdHgTe, InAs, or InSb.

5. The optoelectronic platform according to claim 1 wherein the carbon-based conduction layer is shaped in the form of a rectangle, nanoconstriction, hall-bar or ribbon.

6. An The optoelectronic platform of claim 1 comprising a carbon-based conduction layer (2) and a layer of colloidal quantum dots for absorbing light (1) on top of the carbon-based layer (2), wherein the carbon-based layer comprises graphene, reduced graphene oxide or carbon nanotubes and the an absorbing layer consists of a conjugated dye or polymer.

7. A transistor comprising a source and a drain electrode (Vs, Vd) and an optoelectronic platform comprising a carbon-based conduction layer (2) on top of a substrate and in contact with the source electrode and with the drain electrode and a layer of colloidal quantum dots for absorbing light (1) on top of the carbon-based conduction layer (2), wherein the carbon-based conduction layer is a distinct layer which comprises graphene, reduced graphene oxide or carbon nanotubes.

8. The transistor according to claim 7 further comprising a top electrode in contact with the layer of colloidal quantum dots layer and not in contact with the carbon-based conduction layer.

* * * * *